United States Patent
Trichy

(10) Patent No.: US 10,024,890 B2
(45) Date of Patent: Jul. 17, 2018

(54) USING PCB TEMPERATURE COMPENSATION TRACE TO PERFORM DCR CURRENT SENSING IN POWER SUPPLY CIRCUITRY

(71) Applicant: Active-Semi, Inc., Tortola (VG)

(72) Inventor: Narasimhan Trichy, Plano, TX (US)

(73) Assignee: Active-Semi, Inc. (VG)

( * ) Notice: Subject to any disclaimer, the term of this patent is extended or adjusted under 35 U.S.C. 154(b) by 439 days.

(21) Appl. No.: 14/696,465

(22) Filed: Apr. 26, 2015

(65) Prior Publication Data

US 2016/0313380 A1 Oct. 27, 2016

(51) Int. Cl.
*G01R 19/32* (2006.01)
*G01R 31/40* (2014.01)
*G01R 1/20* (2006.01)

(52) U.S. Cl.
CPC .............. *G01R 19/32* (2013.01); *G01R 1/203* (2013.01); *G01R 31/40* (2013.01)

(58) Field of Classification Search
CPC ......... G01R 19/32; G01R 1/203; G01R 31/40
See application file for complete search history.

(56) References Cited

U.S. PATENT DOCUMENTS

2008/0018402 A1\* 1/2008 Vogman ................. H03F 1/302
330/256

OTHER PUBLICATIONS

LM27403EVM-POL600 30A Ultra-Compact DC/DC Regulator Evaluation Module User's Guide, 2013.\*

\* cited by examiner

*Primary Examiner* — Daniel Miller
(74) *Attorney, Agent, or Firm* — Imperium Patent Works; Amir V. Adibi

(57) ABSTRACT

A system comprises an integrated circuit package, an inductor that is part of a power supply, and a printed circuit board (PCB) having a metal trace disposed directly below the inductor when viewed from a top-down perspective. The integrated circuit package includes a first terminal, a second terminal, and a novel inductor current detection and calibration circuit. The first terminal is coupled to a first end of the metal trace and the second terminal is coupled to a second end of the metal trace. During operation of the power supply, the novel circuit detects an OCP condition whereby an output current of the power supply exceeds an OCP level. The novel circuit detects the OCP condition in part by sensing a voltage across the metal trace. After calibration at room temperature, the novel circuit performs accurate OCP detection over a range of temperatures without using any temperature sensor near inductor.

20 Claims, 12 Drawing Sheets

PERSPECTIVE VIEW OF PCB HAVING POWER SUPPLY CIRCUIT WITH NOVEL PMIC

POWER MANAGEMENT INTEGRATED
CIRCUIT PACKAGE

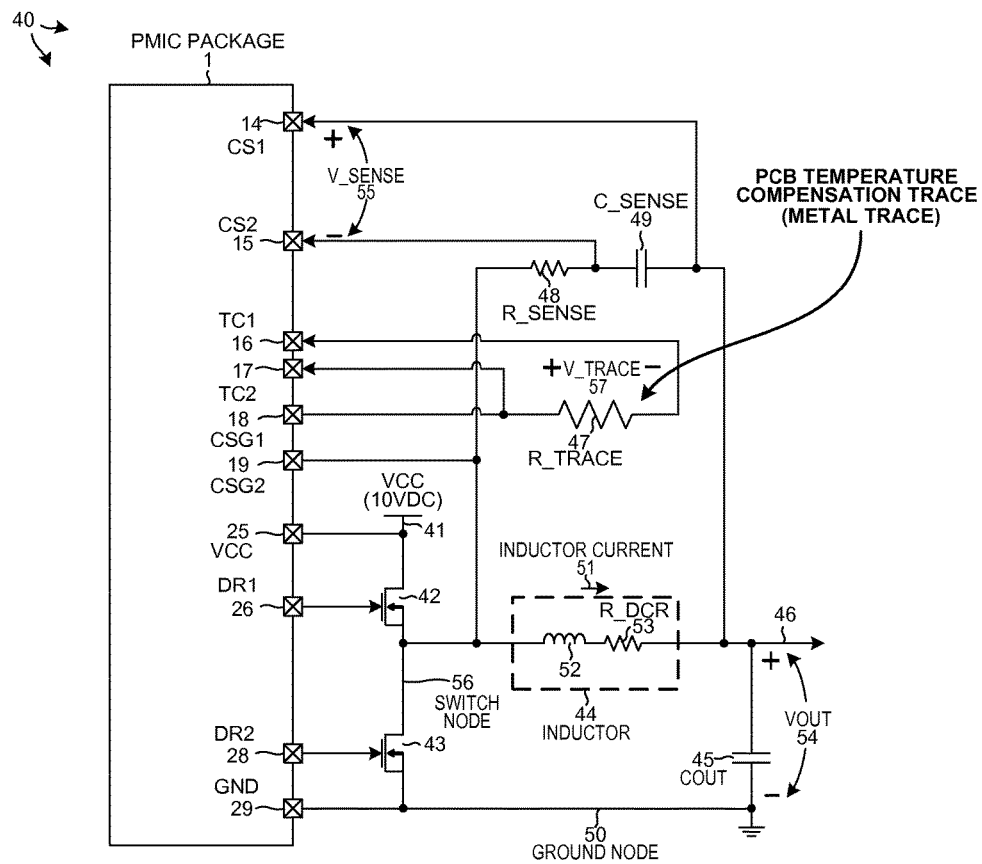
FIG. 2
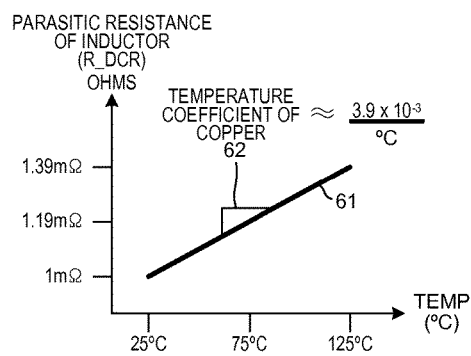
FIG. 3
FIG. 4

PERSPECTIVE VIEW OF PCB HAVING POWER
SUPPLY CIRCUIT WITH NOVEL PMIC

TOP VIEW OF PCB WITH POWER SUPPLY
CIRCUIT AND NOVEL PMIC

EXPANDED VIEW OF METAL TRACE

SQUARE SHAPED METAL TRACE
(ALTERNATE EMBODIMENT)

CALIBRATION CIRCUITRY OF PMIC
(ONE EMBODIMENT)

CALIBRATION AT ROOM TEMPERATURE

CALIBRATION CIRCUITRY OF PMIC
(ANOTHER EMBODIMENT)

CALIBRATION CIRCUITRY OF PMIC
(ANOTHER EMBODIMENT)

USING PCB TEMPERATURE COMPENSATION TRACE TO PERFORM DCR CURRENT SENSING IN POWER SUPPLY CIRCUITRY

TECHNICAL FIELD

The present disclosure relates generally to power management integrated circuits, and more particularly to detecting output current of power supplies.

BACKGROUND INFORMATION

Power supply circuits often supply an output current that flows through an inductor of the power supply. Typically, it is desirable to maintain the output current of such a power supply circuit below an Over Current Protection (OCP) level. To maintain the output current below the OCP level, the output current of the power supply must be sensed. One technique to sense the output current is to place a sense resistor in a path of the output current. However, this is usually undesirable due to the power dissipated through the sense resistor.

To avoid placing a resistor in the path of the output current, Direct Current Resistance (DCR) sensing techniques are often employed. Conventional DCR sensing circuits include a resistor and a capacitor in parallel with the inductor of the power supply. The voltage across the capacitor is sensed during operation of the power supply. The output current can be determined from the sensed voltage across the capacitor. However, to accurately determine the output current, DCR sensing techniques require knowing a resistance of the inductor. The resistance of the inductor is often referred to as a parasitic resistance or a DC resistance of the inductor. During operation of the power supply, the temperature of the inductor will increase. Because the resistance of a conductor varies proportionally with temperature, the DC resistance of the inductor will also increase as the temperature of the inductor increases. Consequently, variations in temperature can result in inaccurate output current sensing when conventional DCR sensing techniques are employed. A solution that overcomes these challenges is desired.

SUMMARY

A system comprises an integrated circuit package, an inductor, and a printed circuit board (PCB) having a metal trace. The inductor is part of a power supply circuit and the inductor is disposed directly above the metal trace when viewed from a top-down perspective. The integrated circuit package includes a first package terminal, a second package terminal, and a power management integrated circuit comprising an inductor current detection and calibration circuit. The first package terminal is coupled to a first end of the metal trace and the second package terminal is coupled to a second end of the metal trace. During operation of the power supply, the inductor current detection and calibration circuit detects whether an output current of the power supply exceeds an Over Current Protection (OCP) level of the power supply. Such condition is referred to as an OCP condition. The inductor current detection and calibration circuit detects the OCP condition, in part, by sensing a voltage across the metal trace via the first and second package terminals.

In one embodiment, the inductor current detection and calibration circuit comprises a current sense circuit, a temperature compensation circuit, a comparator, and a configuration register. The current sense circuit is configured to detect a voltage V_SENSE across a sense capacitor. One lead of the sense capacitor is resistively coupled to a lead of the inductor and another lead of the sense capacitor is coupled to another lead of the inductor. The voltage V_SENSE is indicative of the current flowing through the inductor of the power supply. The current sense circuit supplies an amplified voltage V_SENSE_A onto a first lead of the comparator. The temperature compensation circuit is configured to detect a voltage V_TRACE across the metal trace. The temperature compensation circuit supplies an amplified voltage V_TRACE_A onto a second lead of the comparator.

Resistances of the metal trace and the inductor vary proportionally over a range of temperatures. The metal trace has a similar temperature coefficient as a winding of the inductor of the power supply. In one example, the metal trace exhibits the same resistance as the inductor at room temperature. The metal trace is within 5.0 millimeters from a bottom surface of the inductor. As a result, a temperature at a surface of the metal trace is substantially similar to a temperature of the bottom surface of the inductor. Because the metal trace has the same temperature coefficient as the winding of the inductor and because the metal trace is physically near the inductor, the resistance of the metal trace changes proportionally to the resistance of the inductor across a range of temperatures.

Before the inductor current detection and calibration circuit is to detect an OCP condition during operation of the power supply, the inductor current detection and calibration circuit is calibrated at room temperature (25° C.). The calibration is performed for a particular OCP level. This OCP level is also referred to throughout the specification as the "third current level". In a first calibration step, a first current signal having a first current level is supplied onto the metal trace of the PCB. The temperature compensation circuit senses voltage V_TRACE and performs a sample and hold operation thereby storing voltage V_TRACE.

In a second calibration step, a second current signal having a second current level is supplied onto the inductor of the power supply. The current sense circuit senses voltage V_SENSE across the sense capacitor and performs a sample and hold operation thereby storing voltage V_SENSE. In another example, the second calibration step is performed before the first calibration step. In yet another example, the second calibration step is performed synchronously with the first calibration step. In this example, the first and second current signals are supplied using two separate package terminals, however, in other embodiments, the first and second current signals are supplied using one and only one package terminal.

In a third calibration step, a calibration parameter is determined such that a voltage V_TRACE_A is equal to a voltage V_SENSE_A. The voltage V_TRACE_A is an amplified version of voltage V_TRACE where the amplification is determined by a gain value of the temperature compensation circuit. Similarly, the voltage V_SENSE_A is an amplified version of voltage V_SENSE where the amplification is determined by a gain value of the current sense circuit. In one embodiment, the third calibration step involves: (1) setting a gain of the current sense circuit to a gain value equal to the OCP current level divided by the second current level, and (2) ramping a gain of the temperature compensation circuit until the comparator determines that V_TRACE_A is equal to V_SENSE_A. The final gain values are the calibration parameters.

In a fourth calibration step, the calibration parameters are stored in memory. For example, the calibration parameters are stored in a configuration register of the circuit. The calibration parameter is also stored in a memory accessible by a processor. Before beginning normal operation, the processor reads the calibration parameters and sets the gain values of the inductor current detection and calibration circuit determined by the calibration parameters.

During operation of the power supply, the inductor heats up. The OCP detection is performed over varying temperatures without using any temperature sensor disposed near the inductor. The inductor current detection and calibration circuit determines whether the output current exceeds the OCP level by sensing the voltage across the metal trace via the two package terminals coupled to opposite ends of the metal trace. Conventional power supplies employ DCR sensing in addition to a temperature sensor or temperature sensing component disposed near the inductor of the power supply. Such temperature sensors typically output a signal indicative of temperature and require a supply to operate. The novel inductor current detection and calibration circuit does not, however, involve any temperature sensor on the PCB to perform accurate OCP detection.

The foregoing is a summary and thus contains, by necessity, simplifications, generalizations and omissions of detail; consequently it is appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 2 is a diagram of a system 40 that includes a power supply circuit having an inductor 44.

FIG. 3 is an equation 60 showing the relationship between inductor current 51, voltage V_SENSE 55 across capacitor C_SENSE 49, and resistance R_DCR 53 of inductor 44.

FIG. 4 is a diagram showing how resistance R_DCR 53 varies across a temperature range.

Reference will now be made in detail to some embodiments of the invention, examples of which are illustrated in the accompanying drawings.

DETAILED DESCRIPTION

Figure 1:
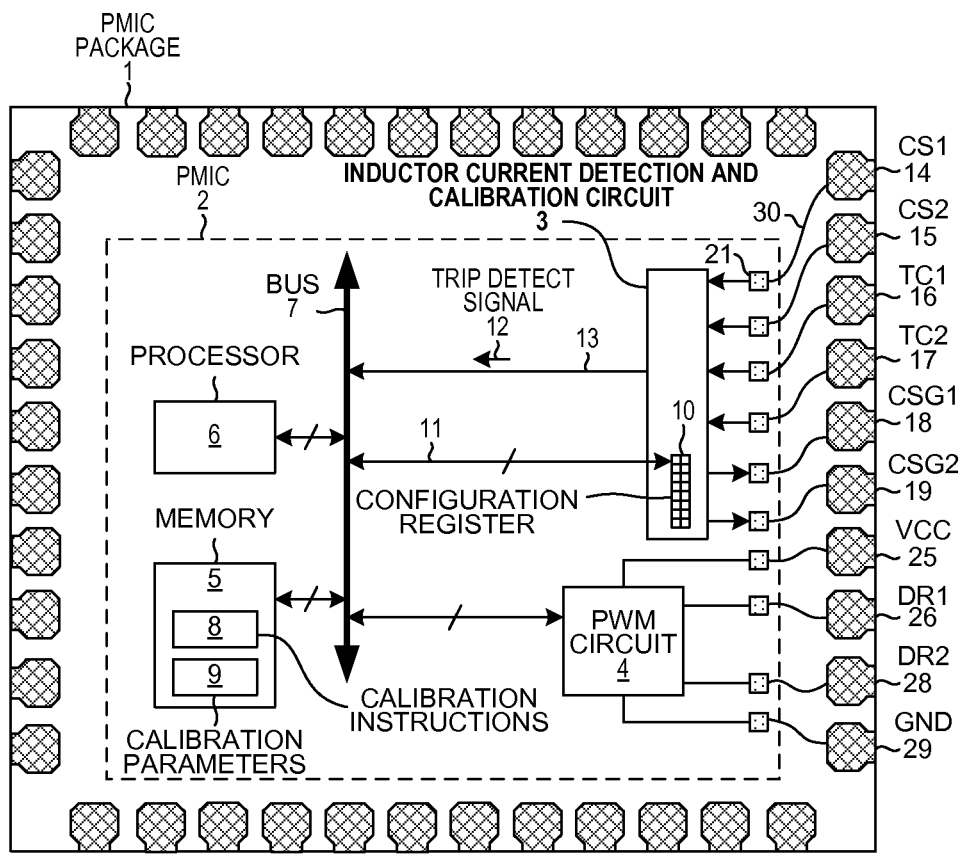
FIG. 1 is a simplified top-down conceptual diagram of a Power Management Integrated Circuit (PMIC) package 1.

FIG. 1 is a simplified top-down conceptual diagram of a Power Management Integrated Circuit (PMIC) package 1 that includes a PMIC 2. PMIC 2 is the rectangular integrated circuit die within integrated circuit package 1. PMIC package 1 includes a row of terminals on each of its four sides. PMIC 2 comprises a inductor current detection and calibration circuit 3, a Pulse Width Modulation (PWM) circuit 4, a memory 5, a processor 6, and a communication bus 7. PWM circuit 4 forms part of a power supply circuit having an inductor (shown in FIG. 2). Processor 6 controls operation of PWM circuit 4 via bus 7. Memory 6 stores an amount of calibration instructions 8 and calibration parameters 9. Inductor current detection and calibration circuit 3 comprises a configuration register 10. Processor 6 can read from and write to memory 5 and configuration register 10 via communication bus 7.

In a calibration mode, processor 6 reads and executes the amount of calibration instructions 8 from memory 5. Processor 6 stores calibration parameters 9 obtained during the calibration mode via conductors 11 and bus 7. In an operation mode, inductor current detection and calibration circuit 3 is operable to detect when a current flowing through an inductor of a power supply circuit (as shown in FIG. 2) exceeds a pre-determined current level or OCP level. Inductor current detection and calibration circuit 3 generates a single bit digital trip detect signal 12 supplied onto conductor 13. If inductor current detection and calibration circuit 3 detects the current flowing through the inductor exceeds the pre-determined current level, then trip detect signal 12 is asserted to a digital logic high level. If inductor current detection and calibration circuit 3 detects the current flowing through the inductor does not exceed the pre-determined current level, then trip detect signal 12 is deasserted to a digital logic low level. Processor 6 is configured to receive the trip detect signal 12 via conductor 13 and bus 7.

PMIC package 1 includes package terminals CS1 14, CS2 15, TC1 16, TC2 17, CSG1 18, and CSG2 19 that are coupled to inductor current detection and calibration circuit 3 via bond wires and terminals of PMIC 2. PMIC package 1 also includes package terminals VCC 25, DR1 26, DR2 28, and GND 29 that are coupled to PWM circuit 4 via bond wires and terminals of PMIC 2. In the diagram of FIG. 1, reference numeral 30 identifies a bond wire that couples package terminal CS1 14 of the package 1 to the terminal 21 of PMIC 2.

FIG. 2 is a diagram of a system 40 that includes a power supply circuit having an inductor 44 where the power supply circuit is controlled by PMIC 2 within PMIC package 1. System 40 comprises the PMIC package 1, a supply node 41, transistors 42 and 43, the inductor 44, capacitor 45, an output node 46, metal trace 47, an RC filter involving resistor R_SENSE 48 and capacitor C_SENSE 49, and ground node 50. Package terminal CS1 14 is coupled to a lead of capacitor C_SENSE 49 and output node 46. Package terminal CS2 15 is coupled to another lead of capacitor C_SENSE 49 and to a lead of resistor R_SENSE 48. Package terminal TC1 16 is coupled to an end of metal trace 47. Package terminals TC2 17 and CSG1 18 are both coupled to another end of metal trace 47. Package terminal CSG2 19 is coupled to another end of resistor R_SENSE 48. Package terminal VCC 25 is coupled to the supply node 41. Package terminal DR1 26 is coupled to drive a gate of transistor 42 and package terminal DR2 28 is coupled to drive a gate of transistor 43. Package terminal GND 29 is coupled to ground node 50.

During operation of the power supply circuit, an inductor current 51 flows through inductor 44. Inductor 44 has an inductance 52 and a Direct Current Resistance (DCR) R_DCR 53. Resistance R_DCR 53 is also referred to as a "parasitic resistance" of inductor 44. An output voltage VOUT 54 is present between output node 46 and ground node 50. Inductor current 51 is sensed by detecting voltage V_SENSE 55 across capacitor C_SENSE 49. Accordingly, resistor R_SENSE 48 and capacitor C_SENSE 49 are also referred to as a sense resistor and a sense capacitor, respectively.

In accordance with one novel aspect, PMIC 2 senses a voltage V_TRACE 57 across metal trace 47 to compensate for variation of resistance R_DCR 53 over a range of temperatures. Metal trace 47 is also referred to as a PCB temperature compensation trace. Metal trace 47 is a metal trace of a Printed Circuit Board (PCB) and is disposed directly below the inductor 44 when viewed from a top-down perspective. Metal trace 47 has the same metal type as the inductor 44. In this example, metal trace 47 is a copper trace and inductor 44 has a copper winding.

FIG. 3 is an equation 60 showing the relationship between inductor current 51, voltage V_SENSE 55 across capacitor C_SENSE 49, and resistance R_DCR 53 of inductor 44. Equation 60 shows that inductor current 51 can be determined indirectly by sensing voltage V_SENSE 55 across capacitor C_SENSE 49 if resistance R_DCR 53 of inductor 44 is known. Resistance R_DCR 53 of inductor 44 is typically known and provided by an entity that manufactures inductor 44. However, the parasitic resistance of an inductor is temperature dependent and does not stay constant across temperature. Metal trace 47 is used to compensate for varying resistance R_DCR 53 over temperature.

FIG. 4 is a diagram showing how resistance R_DCR 53 varies across a temperature range. Line 61 represents the resistance R_DCR 53 from 25° C. to 125° C. Slope 62 of line 61 is a temperature coefficient of copper indicating how resistance of copper changes with a change in temperature. Metal trace 47 is of a metal having the same temperature coefficient (within 0.1%) as a metal winding of inductor 44.

Figure 5:
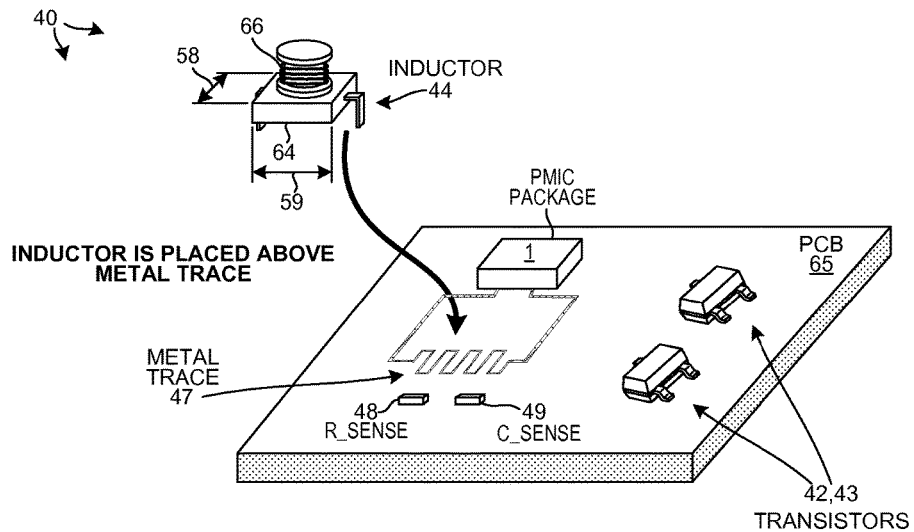
FIG. 5 is a diagram of a perspective view of system 40 realized on a printed circuit board (PCB) 65.

FIG. 5 is a diagram of a perspective view of system 40 realized on a printed circuit board (PCB) 65. Inductor 44 includes a winding 66 of metal of the same type as metal trace 47. In this example, winding 66 and metal trace 47 are copper metal. During assembly, inductor 44 is placed directly above metal trace 47. Metal 47 is a distance between 0.10 millimeter and 10.0 millimeters from a bottom surface 64 of the inductor 44. In this example, metal 47 is within 5.0 millimeters of a bottom surface 64 of the inductor 44. No discrete temperature sensor or packaged temperature device that outputs a signal indicative of a temperature measurement is within 100.0 millimeters of inductor 44. Inductor 44 has a first length 58 and a second length 59. No discrete temperature sensor or packaged temperature device that outputs a signal indicative of a temperature measurement is within two times the first length 58, and no discrete temperature sensor or packaged temperature device that outputs a signal indicative of a temperature measurement is within two times the second length 59. In another example, no discrete temperature sensor or packaged temperature device that outputs a signal indicative of a temperature measurement is within ten times the first length 58, and no discrete temperature sensor or packaged temperature device that outputs a signal indicative of a temperature measurement is within ten times the second length 59. In yet another example, metal 47 is in direct contact with the bottom surface 64 of the inductor 44. Due to the proximity of metal trace 47 to the inductor 44, metal trace 47 will exhibit a substantially similar temperature (within 1.0%) as metal winding of inductor 44 during operation of the power supply. In one example, the resistance of metal trace 47 is substantially equivalent (within 1.0%) to resistance R_DCR 53 of inductor 44.

Figure 6:
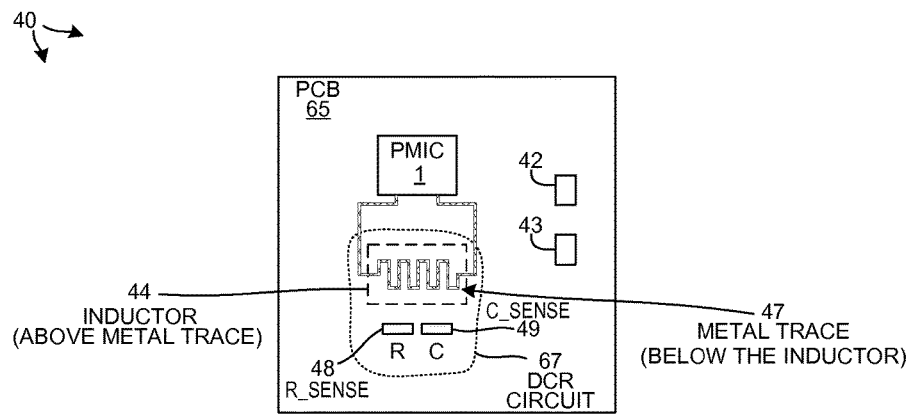
FIG. 6 is a diagram of a top-down view of system 40 realized on PCB 65.

FIG. 6 is a diagram of a top-down view of system 40 realized on PCB 65. Inductor 44 is placed directly above metal trace 47. Inductor 44 entirely surrounds metal trace 47 when viewed from a top down perspective. A surface area of inductor 44 is greater than a surface area of metal trace 47. Inductor 44, sense resistor R_SENSE 48, and sense capacitor C_SENSE 49 are also referred to as a DCR sense circuit 67. In this example, metal trace 47 has a square wave shape.

Figure 7:
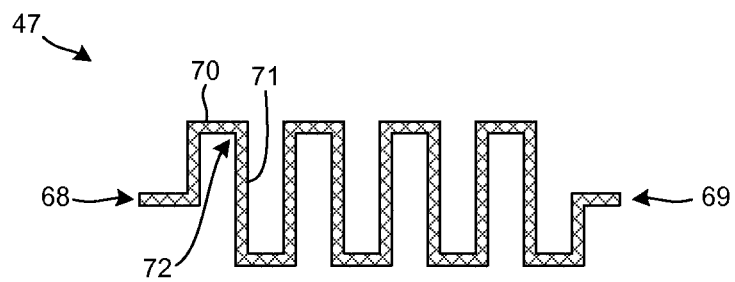
FIG. 7 is an expanded view of the metal trace 47.

FIG. 7 is an expanded view of the metal trace 47. Metal trace 47 has a square wave shape when viewed from a top-down perspective of PCB 65. A first portion 70 and a second portion 71 of the metal trace 47 are attached to and electrically coupled to each other. Second portion 71 is substantially perpendicular to first portion 70. In one example, second portion 71 is at least twice as long as first portion 70. First portion 70 and second portion 71 form an angle 72. In the example of FIG. 7, angle 72 is a ninety degree angle. In another example, metal trace 47 is a sawtooth wave shape such that angle 72 is less than ninety degrees. In yet another example, metal trace 47 is a triangle wave shape such that angle 72 is greater than ninety degrees. An end 68 of metal trace 47 is coupled to package terminal TC1 16 of PMIC package 1 and an end 69 of metal trace 47 is coupled to package terminal TC2 17 of PMIC package 1. Metal trace 47 is also referred to as a Printed Circuit Board (PCB) temperature compensation trace.

Figure 8:
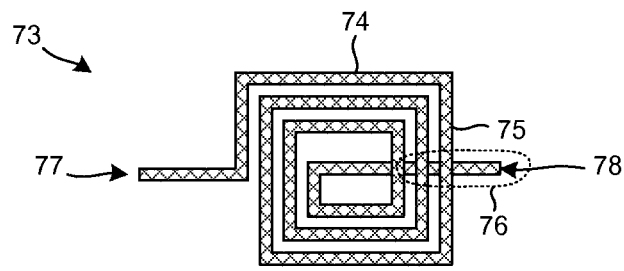
FIG. 8 is a diagram of another embodiment of a metal trace 73 having a square shape.

FIG. 8 is a diagram of another embodiment of a metal trace 73 having a spiral shape when viewed from a top-down perspective of PCB 65. Metal trace 73 includes portions that are arranged in a spiral fashion such that each portion closer to the center is shorter in length than the portions further from the center. The portions of metal trace 73 are attached at ninety degree angles with respect to each other. All portions of metal trace 73 are electrically coupled to each other. A first portion 74 is attached to a second portion 75 such that second portion 75 is substantially perpendicular to first portion 74. Some portions of metal trace 73 extend through a different layer of PCB 65 than other portions. For example, first portion 74 and second portion 75 extend through a layer of the PCB and a third portion 76 extends through another layer (not shown) of the PCB 65. An end 77 of metal trace 47 is coupled to package terminal TC1 16 of PMIC package 1 and an end 78 of metal trace 47 is coupled to package terminal TC2 17 of PMIC package 1.

Figure 9:
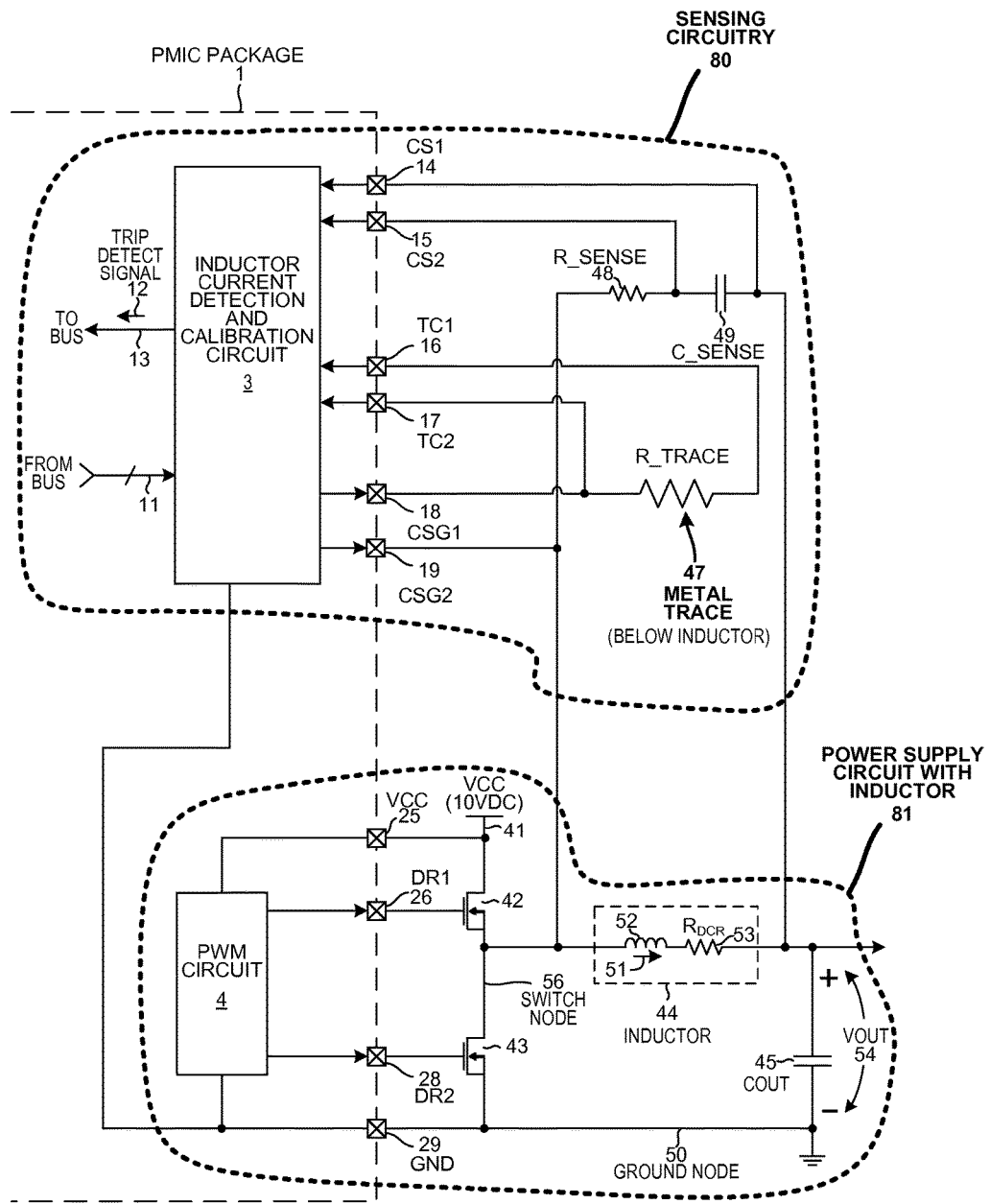
FIG. 9 is a high level diagram showing sensing circuitry 80 and a power supply circuit 81.

FIG. 9 is a high level diagram showing sensing circuitry 80 and a power supply circuit 81 having an inductor 44. Sensing circuitry 80 includes inductor current detection and calibration circuit 3 within PMIC package 1, sense resistor R_SENSE 48, sense capacitor C_SENSE 49, and metal trace 47. Power supply circuit 81 includes PWM circuit 4 within PMIC package 1, supply node 41, transistors 42 and 43, inductor 44, and output capacitor 45. In this example, supply node 41 is supplied by a 10V Direct Current (DC) supply. Transistors 42 and 43 are N-type metal oxide semiconductor field effect transistors (NFETs). In another embodiment, transistors 42 and 43 are insulated gate bipolar transistors (IGBTs). Sensing circuit 80 is calibrated to sense when output current 51 exceeds a pre-determined current level during operation of power supply circuit 81 over a range of temperatures. The pre-determined current level is often referred to in the art as a Over Current Protection (OCP) level. Inductor current detection and calibration circuit 3 is to detect when current 51 flowing through inductor 44 is greater than the OCP level so that power supply 81 can be controlled to switch off.

Figure 10:
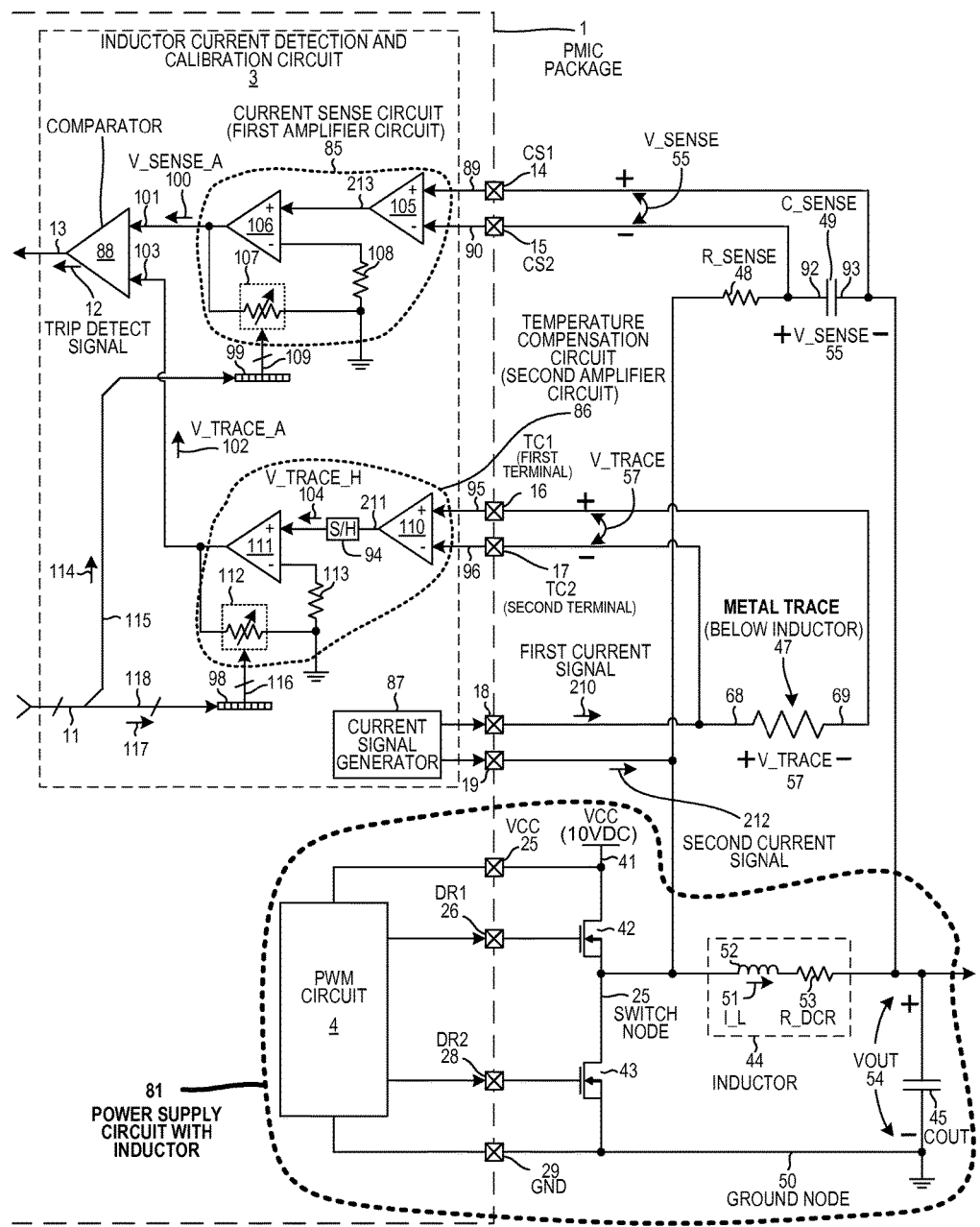
FIG. 10 is a detailed diagram of current detection and calibration circuit 3 in accordance with one embodiment.

FIG. 10 is a detailed diagram of current detection and calibration circuit 3 in accordance with one embodiment. Current detection and calibration circuit 3 includes a current sense circuit 85, a temperature compensation circuit 86, a current signal generator 87, and a comparator 88. Various configuration bits of the inductor current detection and calibration circuit 3 are identified by reference numerals 98 and 99. Although these bits are illustrated as being placed in different locations in the circuit, the configuration bits are bits of single configuration register 10. Processor 6 writes to configuration bits 98 and 99 via bus 7 and conductors 11. Inductor current detection and calibration circuit 3 generates and outputs trip detect signal 12 to processor 6 via conductor 13 and bus 7.

Current sense circuit 85 has a first node 89 that is coupled to package terminal CS1 14 and a second node 90 that is coupled to package terminal CS2 15. Current sense circuit 85 comprises differential amplifiers 105 and 106, a digitally-programmable resistance 107, and a resistor 108. Differential amplifier 106, digitally-programmable resistance 107, and resistor 108 form a voltage gain amplification circuit where a gain is controlled by setting the appropriate resistance of digitally-programmable resistance 107. Current sense circuit 85 is configured to detect the voltage V_SENSE 55 between lead 92 of sense capacitor C_SENSE 49 and lead 93 of sense capacitor C_SENSE 49 via package terminals CS1 14 and CS2 15. Voltage V_SENSE 55 is indicative of output current 51 flowing through inductor 44. Current sense circuit 85 outputs voltage V_SENSE_A 100 onto a first input node 101 of comparator 88. Voltage V_SENSE_A 100 is voltage V_SENSE 55 voltage amplified by a gain value. The gain value is determined by a multi-bit digital value stored in configuration bits 99 that sets the resistance of digitally-programmable resistance 107 via conductors 109. For example, processor 6 writes multi-bit digital value 114 to configuration bits 99 via conductors 11 and 115.

Temperature compensation circuit 86 has a first node 95 that is coupled to package terminal TC1 16 and a second node 96 that is coupled to package terminal TC2 17. Temperature compensation circuit 86 comprises differential amplifiers 110 and 111, a sample and hold circuit 94, a digitally-programmable resistance 112, and a resistor 113. Sample and hold circuit 94 is controlled to sample and hold the sensed voltage V_TRACE 57 and output V_TRACE_H 104 onto an input of differential amplifier 111. Differential amplifier 111, digitally-programmable resistance 112, and resistor 113 form a voltage gain amplification circuit where a gain is controlled by setting the appropriate resistance of digitally-programmable resistance 112. Temperature compensation circuit 86 is configured to detect the voltage V_TRACE 57 between end 68 of metal trace 47 and end 69 of metal trace 47 via package terminals TC1 16 and TC2 17. Voltage V_TRACE 57 is the voltage across metal trace 47. Because the resistance of metal trace 47 varies with temperature, voltage V_TRACE 57 also varies with temperature. Temperature compensation circuit 86 outputs voltage V_TRACE_A 102 onto a second input node 103 of comparator 88. Voltage V_TRACE_A 102 is voltage V_TRACE 57 voltage amplified by a gain value. The gain value is determined by a multi-bit digital value stored in configuration bits 98 that sets the resistance of digitally-programmable resistance 112 via conductors 116. For example, processor 6 writes multi-bit digital value 117 to configuration bits 98 via conductors 11 and 118.

Figure 11:
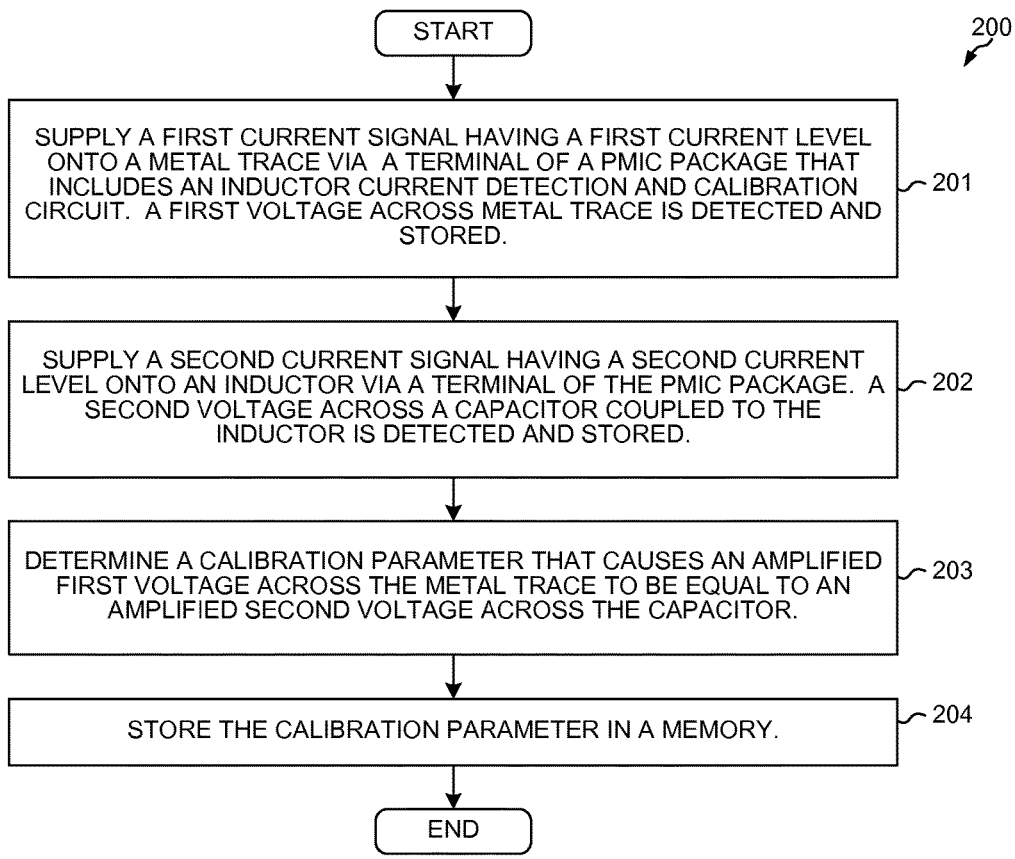
FIG. 11 is a method 200 in accordance with one novel aspect.

FIG. 11 is a method 200 in accordance with one novel aspect. Method 200 calibrates inductor current detection and calibration circuit 3. Steps of method 200 are to be performed at room temperature (25° C.). In a first step (step 201), a first current signal having a first predetermined current level is supplied onto a metal trace via a terminal of an integrated circuit having a current detection and calibration circuit. The metal trace is part of a Printed Circuit Board (PCB). A first voltage across the metal trace is detected and stored. For example, in FIG. 10, a first current signal 210 is supplied onto metal trace 47 via terminal CSG1 18 of PMIC package 1. Differential amplifier 110 of temperature compensation circuit 86 detects voltage V_TRACE 57 between terminal TC1 16 and terminal TC2 17. Voltage V_TRACE 57 is the voltage across metal trace 47 when the first pre-determined current level flows through metal trace 47 at room temperature. Sample and hold circuit 94 receives the detected voltage V_TRACE 57 from an output 211 of differential amplifier 110 and outputs V_TRACE_H 104 onto an input of differential amplifier 111.

In a second step (step 202), a second current signal having a second predetermined current level is supplied onto an inductor via a terminal of the integrated circuit. The inductor is disposed on the PCB and is part of a power supply circuit controlled by the integrated circuit. The metal trace is disposed directly below the inductor of the power supply circuit. A second voltage across a capacitor is detected and stored. A first lead of the capacitor is coupled to a first end of the inductor and a second lead of the capacitor is resistively coupled to a second end of the inductor. For example, in FIG. 10, a second current signal 212 is supplied onto inductor 44 via terminal CSG2 19 of PMIC package 1. Differential amplifier 105 of current sense circuit 85 detects voltage V_SENSE 55 between terminal CS1 14 and terminal CS2 15. Voltage V_SENSE 55 is the voltage between lead 92 and lead 93 of sense capacitor C_SENSE 49 when the first pre-determined current level flows through inductor 44 at room temperature. In another embodiment, current sense circuit 85 employs a sample and hold circuit as in circuit 86 to sample and hold the voltage V_SENSE 55 at an output 213 of differential amplifier 105.

In a third step (step 203), a calibration parameter is determined that causes an amplified signal of the first voltage across the metal trace to be equal to an amplified signal of the second voltage across the capacitor. For example, in FIG. 10, the gain value of current sense circuit 85 is set to an OCP level of power supply circuit 81 divided by the second current level of second current signal 212. The OCP level of power supply circuit 81 is also referred to as a third current level. Processor 6 sets the gain value of current sense circuit 85 by writing multi-bit digital value 114 to configuration bits 99. Multi-bit digital value 114 sets resistance of digitally-programmable resistance 107 such that the gain value is the third current level (OCP) divided by the second current level. Next, the gain value of temperature compensation circuit 86 is increased until comparator 88 trips thereby indicating that V_SENSE_A 100 is equal to V_TRACE_A 102. Processor 6 increases the gain value of temperature compensation circuit 86 by writing multi-bit digital value 117 to configuration bits 98. When comparator 88 trips, trip detect signal 12 is asserted from a digital logic low level to a digital logic high level. Processor 6 receives the asserted trip detect signal 12 indicating that the calibration is complete. The final gain value causing comparator 88 to trip is the desired calibration parameter.

In a fourth step (step 204), the calibration parameter is stored in memory. In the example of FIG. 10, the calibration parameter is the multi-bit digital value stored in configuration bits 98 that voltage amplify V_TRACE 57 by a gain value causing V_TRACE_A 102 to be equivalent to V_SENSE_A 100. Configuration bits 98 are part of configuration register 10 as shown in FIG. 1. Calibration parameter is also stored in memory 5, as shown in FIG. 1. In other embodiments, the calibration parameter is only stored in configuration register 10.

Figure 12:
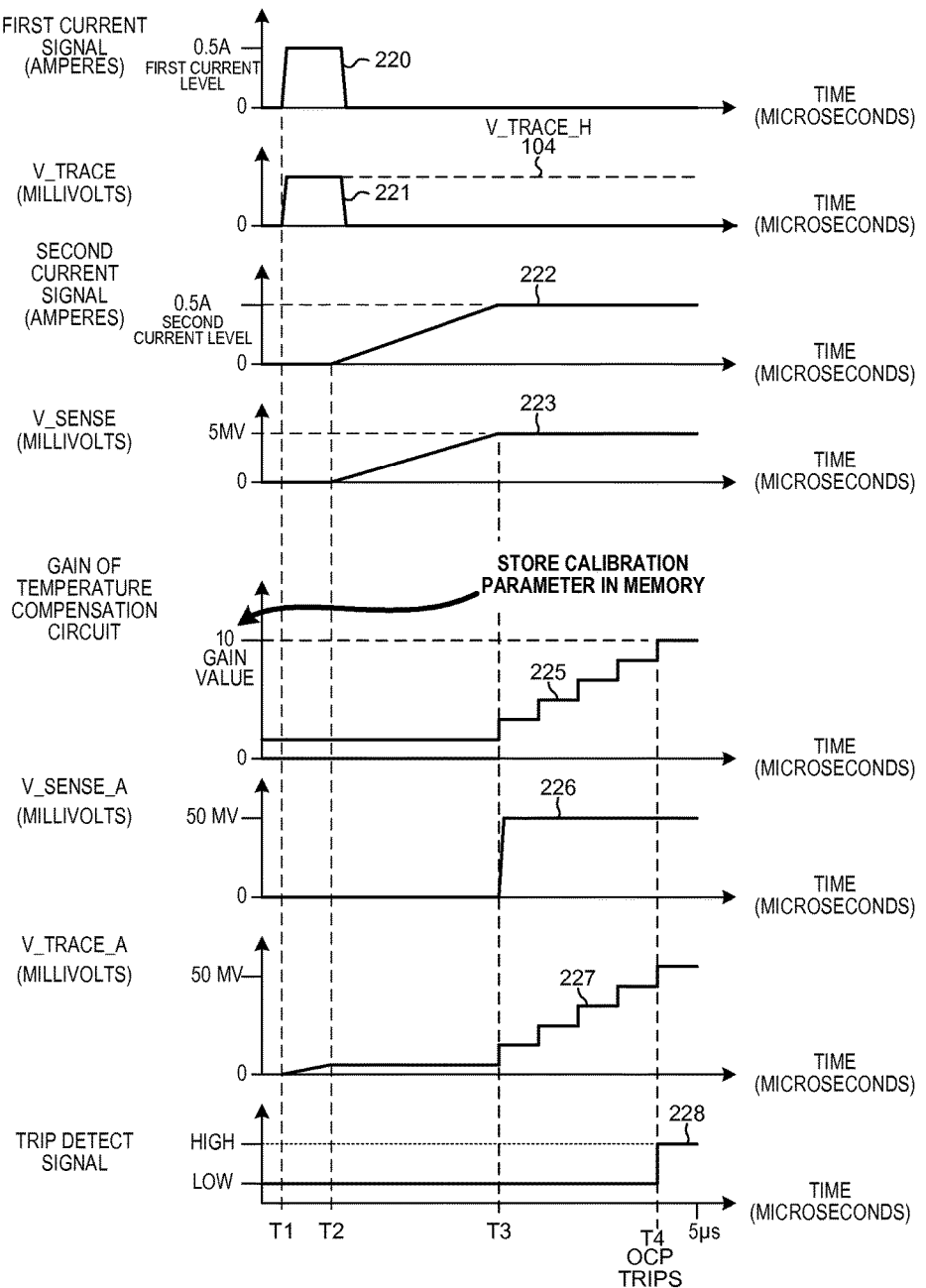
FIG. 12 is a set of waveform diagrams along various nodes during calibration at room temperature of inductor current detection and calibration circuit 3.

FIG. 12 is a set of waveform diagrams along various nodes during calibration at room temperature of inductor current detection and calibration circuit 3. Waveform 220 is current of first current signal 210 during calibration. Waveform 221 is voltage V_TRACE 57 across metal trace 47 during calibration. In this example, sample and hold circuit 94 generates and outputs V_TRACE_H 104. Waveform 222 is current of second current signal 212 during calibration. Waveform 223 is voltage V_SENSE 55 across metal trace 47 during calibration. Waveform 225 is the gain of temperature compensation circuit 86 during calibration. Waveform 226 is voltage V_SENSE_A 100 that is output by current sense circuit 85 during calibration. Waveform 227 is voltage V_TRACE_A 102 that is output by temperature compensation circuit 86 during calibration. Waveform 228 is trip detect signal 12 during calibration. Labels T1, T2, T3, and T4 identify times throughout the calibration and correspond to steps 201-204 of method 200 shown in the flowchart of FIG. 11.

At time T1, current signal generator 87 generates and supplies a first current signal 210 onto metal trace 47 via package terminal CSG1 18. First current signal 210 has a first current level of 0.5 amperes. At time T2, current signal generator 87 generates and supplies second current signal 212 onto inductor 44 via package terminal CSG2 19. In this example, the OCP level (referred to as the "third current level") of power supply circuit 81 is 5.0 amperes. The first current level and the second current level are chosen to be ¹⁄₁₀ of the OCP level of the power supply circuit 81. At time T3, the gain of current sense circuit 85 is set to 10.0 determined by dividing the third current level (OCP) by the second current level (5.0 A/0.5 A=10.0). Accordingly, at time T3, voltage V_SENSE_A 100 output by current sense circuit 85 ramps up to 50.0 millivolts as shown by waveform 226. Next, the gain of temperature compensation circuit 86 is ramped up causing voltage V_TRACE_A 102 to ramp up as shown by waveform 227. At time T4, voltage V_TRACE_A 102 output by temperature compensation circuit 86 is equal to voltage V_SENSE_A 100 output by current sense circuit 85 thereby causing comparator 88 to trip. At time T4, trip detect signal is asserted from a digital logic low level to a digital logic high level as shown by waveform 228. The gain value of temperature compensation circuit 86 is the calibration parameter stored in configuration bits 98 which are part of configuration register 12. The gain value is used during normal operation to detect when output current of power supply circuit 81 exceeds the OCP level.

Figure 13:
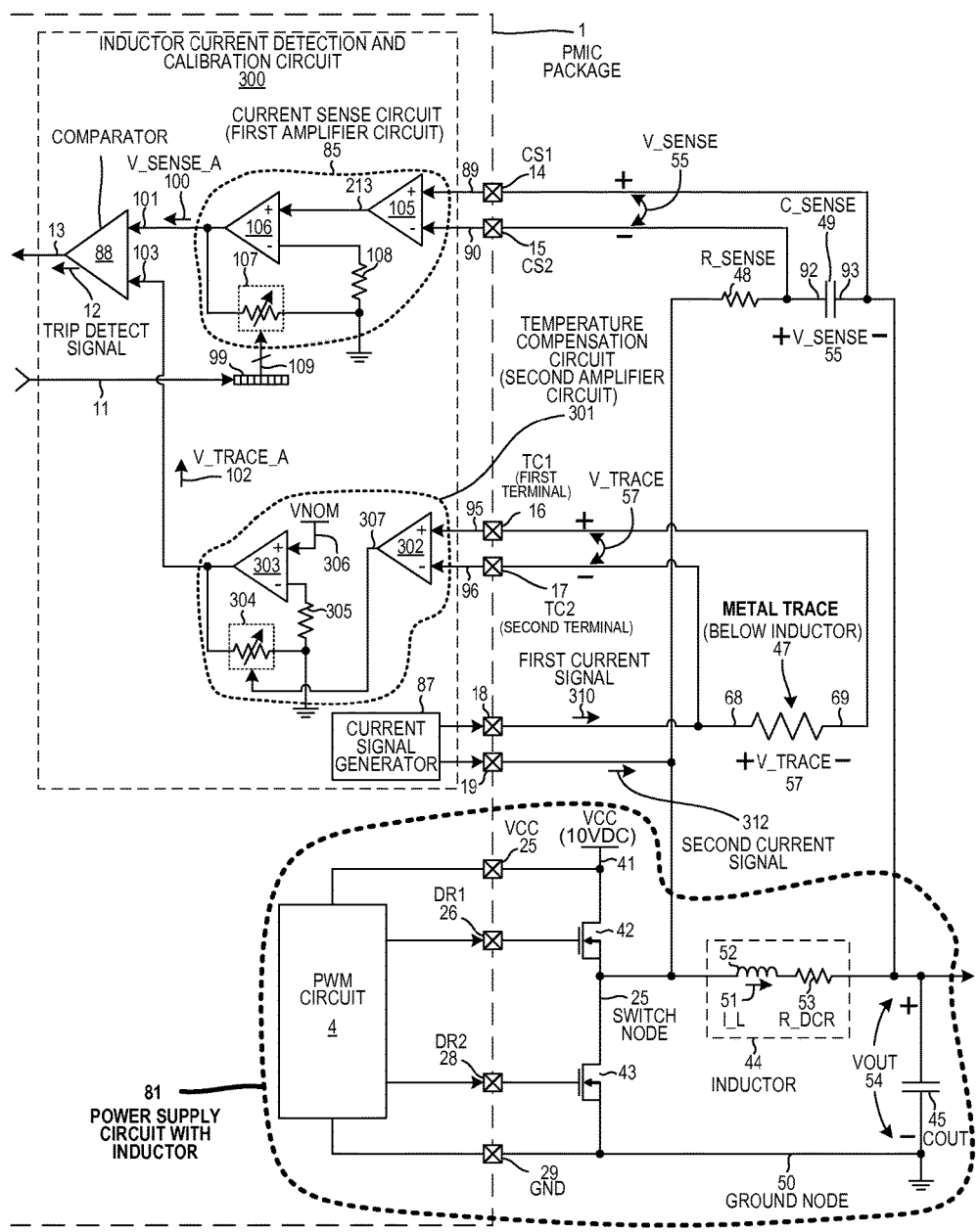
FIG. 13 is a diagram of another embodiment of inductor current detection and calibration circuit 300.

FIG. 13 is a diagram of another embodiment of inductor current detection and calibration circuit 300. Inductor current detection and calibration circuit 300 is similar to inductor current detection and calibration circuit 3 of FIG. 10, except that a gain of temperature compensation circuit 301 varies according to temperature. Temperature compensation circuit 301 comprises differential amplifiers 302 and 303, digitally-programmable resistance 304, resistance 305, and supply node 306. Differential amplifier 302 is coupled to detect voltage V_TRACE 57 across metal trace 47 via package terminal TC1 16 and package terminal TC2 17. Differential amplifier 303, digitally-programmable resistance 304, and resistor 305 form a voltage gain amplification circuit where a gain is controlled by output 307 of differential amplifier 302. Accordingly, the gain of temperature compensation circuit 301 is proportional to voltage V_TRACE 97. During normal operation, as temperature increases, the resistance of metal trace 47 increases. When the resistance of metal trace 47 increases, voltage V_TRACE 57 increases causing differential amplifier 302 to increase the resistance of digitally-programmable resistance 304. As a result, the gain of temperature compensation circuit 301 increases proportionally with temperature. Temperature compensation circuit 301 is calibrated in accordance with method 200.

Figure 14:
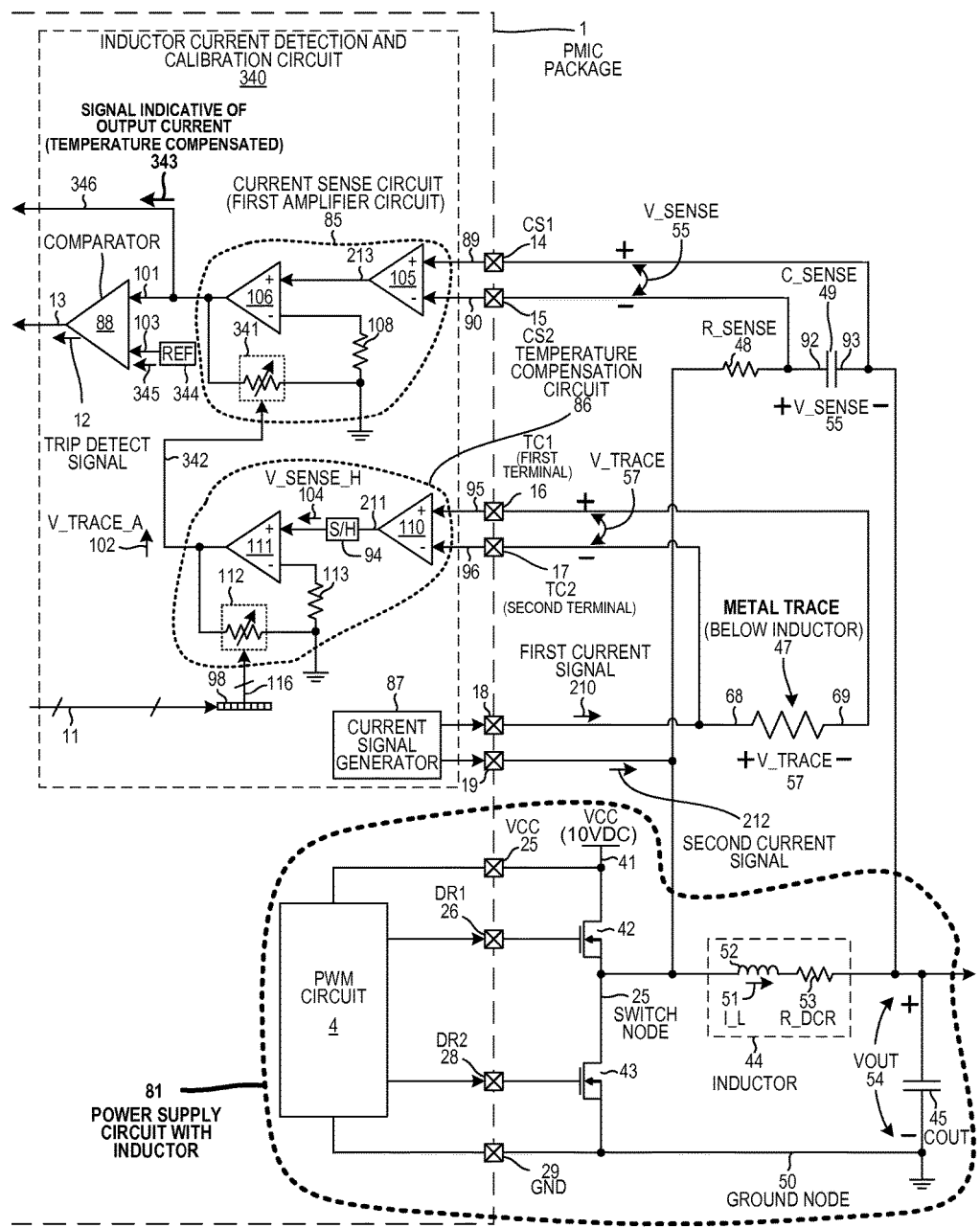
FIG. 14 is a diagram of another embodiment of inductor current detection and calibration circuit 340.

FIG. 14 is a diagram of another embodiment of inductor current detection and calibration circuit 340. Inductor current detection and calibration circuit 340 is similar to inductor current detection and calibration circuit 3 of FIG. 10, except that a gain of current sense circuit 85 varies according to temperature. A digitally-programmable resistance 341 is coupled to receive voltage V_TRACE_A 102 via conductor 342. A resistance of digitally-programmable resistance 341 is configured using the voltage V_TRACE_A 102 by circuitry within digitally-programmable resistance 341. Accordingly, as temperature of metal trace 47 increases, a gain of current sense circuit 85 increases. Similarly, as temperature of metal trace 47 decreases, a gain of current sense circuit 85 decreases. The current sense circuit 85 outputs a signal 343 indicative of the output current onto input 101 of the comparator 88. Reference voltage generator 344 is calibrated to output a reference voltage 345 such that comparator 88 asserts trip detect signal 12 when the average output current of power supply circuit 81 exceeds a predetermined threshold current.

In accordance with another novel aspect, signal 341 is also supplied onto conductor 346. Signal 343 is available to other circuitry within PMIC package 1 via conductor 346. Signal 343 compensates for variation in temperature because the gain of the current sense circuit 85 varies according to temperature. Conventional techniques require a temperature sensing circuit near the output inductor to accurately sense the output current I_L 51 of the power supply circuit 81. In the example of FIG. 14, however, no temperature sensing circuit is involved in generating signal 343. Accordingly, other circuitry within PMIC package uses signal 343 when a temperature compensated measurement of output current I_L 51 of power supply circuit 81 is desired.

Figure 15:
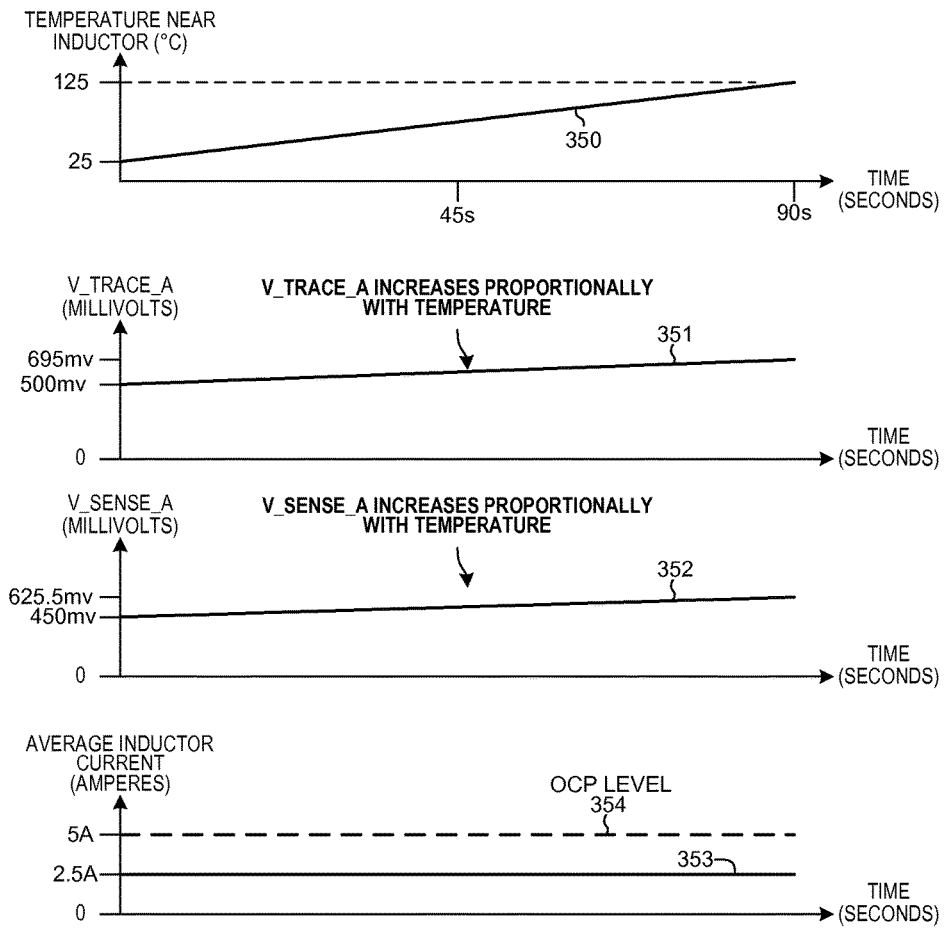
FIG. 15 is a diagram showing how the current detection and calibration circuit of PMIC package 1 detects when output current 51 of power supply circuit 81 exceeds the OCP level during normal operation.

FIG. 15 is a diagram showing how the current detection and calibration circuit of PMIC package 1 detects when output current 51 of power supply circuit 81 exceeds the OCP level during normal operation. Waveform 350 represents temperature along a surface of the inductor 44. Waveform 351 is voltage V_TRACE_A 102 during operation of power supply circuit 81. Waveform 352 is voltage V_SENSE_A 100 during operation of power supply circuit 81. During operation of power supply 81, temperature along inductor 44 increases from 25° C. to 125° C. As the temperature increases from 25° C. to 125° C., voltage V_TRACE_A 102 and voltage V_SENSE_A 100 increase proportionally with temperature. Waveform 353 shows average current flowing through inductor 44 that is output by power supply circuit 81 during normal operation. Reference numeral 354 identifies an OCP level of power supply circuit 81. During normal operation of the power supply circuit 81, the current detection and calibration circuit of PMIC package 1 operates to detect when current 51 that is output by power supply circuit 81 exceeds the OCP level. In this example, the OCP level is 5.0 amperes.

If, on the other hand, conventional DCR sensing techniques were to be employed, then the increase in temperature would cause a DCR sensing circuit to undesirably detect an OCP condition. Accordingly, metal trace 47 is also referred to as a "temperature compensation trace". Conventional techniques known in the art employ a temperature sensor near an inductor of a power supply. This increases the cost of conventional power supplies. Moreover, the temperature sensor does not yield accurate temperature measurement of the inductor temperature. Novel system 40, however, does not include any temperature sensor or sensing component disposed near (within 100.0 millimeters) of inductor 44 of system 40. No temperature sensor or sensing component is utilized by the inductor current detection and calibration circuit 3 in sensing whether output current of the power supply 81 exceeds the OCP level. In addition, because the metal trace 47 is disposed directly below the inductor 44 (within 5.0 millimeters), the temperature of metal trace 47 is substantially the same as the temperature of inductor 44. In one example, the temperature of metal trace 47 is within 5.0% of the temperature of inductor 44. As such, by employing system 40, fabrication costs are reduced and OCP detection is more accurate as compared to techniques known in the art.

Figure 16:
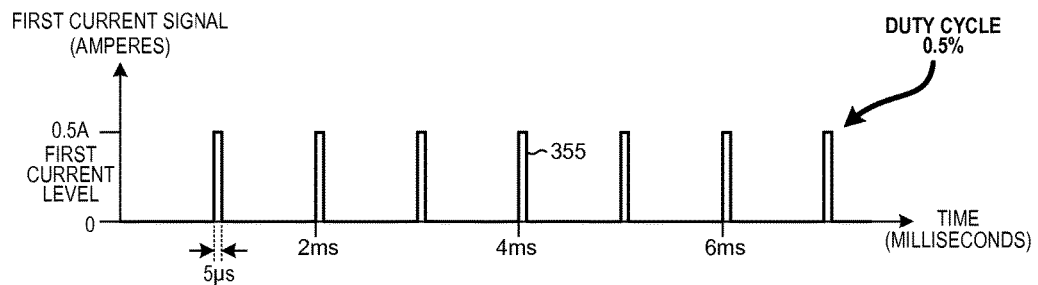
FIG. 16 is a diagram of waveform 355 showing the low duty cycle of the first current signal resulting in desirable power savings over the prior art.

FIG. 16 is a diagram of waveform 355 showing the low duty cycle of the first current signal resulting in desirable power savings over the prior art. In this example, the first current signal is set to the first current level for five microseconds repeated every millisecond thereby having a duty cycle of 0.5%. To minimize power consumption, the first current signal has a duty cycle between 0.1% and 1.0%. In another embodiment, the first current signal has a duty cycle between 1.0% and 10.0%. Voltage V_TRACE 57 is sampled and held by sample and hold circuit 94 as shown in FIG. 10.

Figure 17:
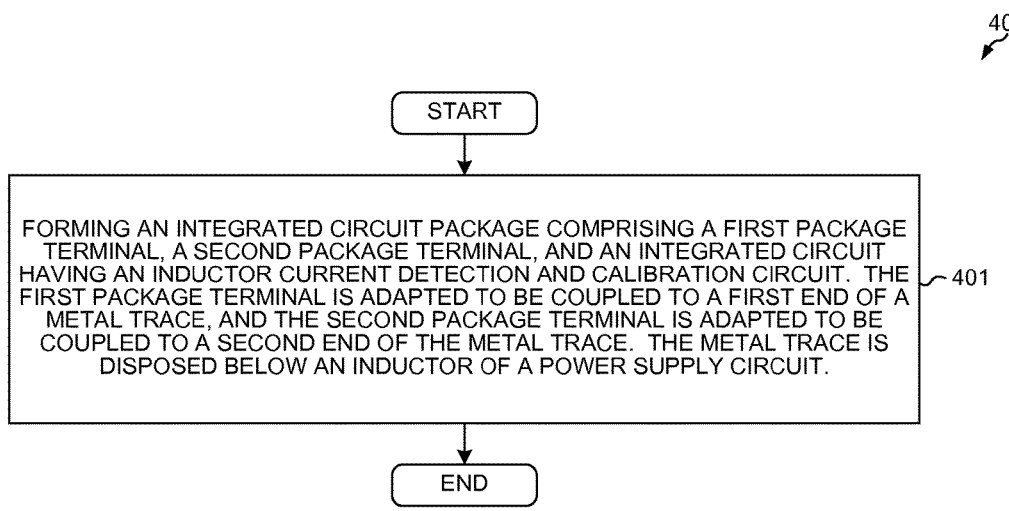
FIG. 17 is a flowchart of a method 400 in accordance with another novel aspect.

FIG. 17 is a flowchart of a method 400 in accordance with another novel aspect. In a first step (step 401), an integrated circuit package is formed that comprises a first package terminal, a second package terminal, and an integrated circuit having an inductor current detection and calibration circuit. The first package terminal is adapted to be coupled to a first end of a metal trace and the second package terminal is adapted to be coupled to a second end of the metal trace. The metal trace is disposed below an inductor of a power supply circuit. For example, in FIG. 1 PMIC integrated circuit package 1 comprises package terminal TC1 16, package terminal TC2 17 and PMIC 2 that includes inductor current detection and calibration circuit 3. PMIC integrated circuit package 1 is selected from the group consisting of: a Quad Flat Package (QFP), a ceramic pin grid array (PGA) package, and a ball grid array (BGA) package.

Figure 18:
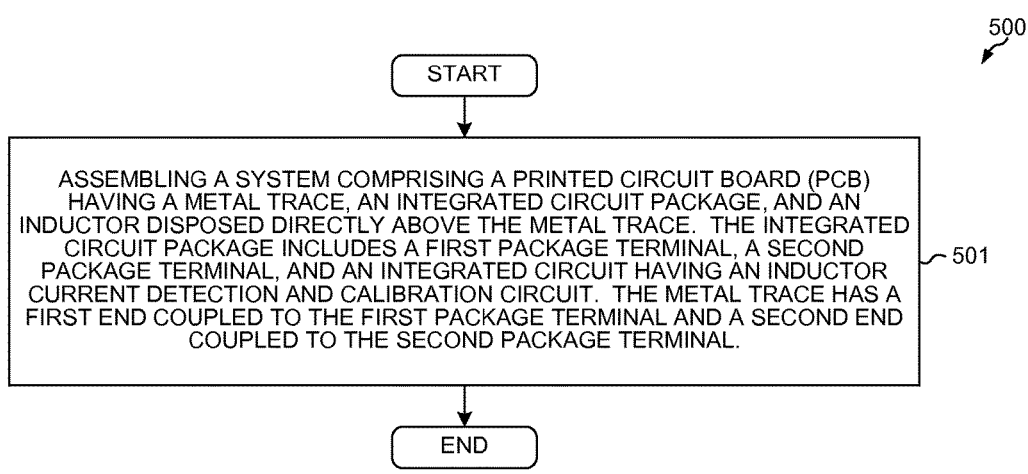
FIG. 18 is a flowchart of a method 500 in accordance with another novel aspect.

FIG. 18 is a flowchart of a method 500 in accordance with another novel aspect. In a first step (step 501), a system is assembled that includes a printed circuit board having a metal trace, an integrated circuit package, and an inductor disposed above the metal trace. The integrated circuit package comprises a first package terminal, a second package terminal, and an integrated circuit having an inductor current detection and calibration circuit. For example, in FIG. 5, system 40 is assembled that includes PCB 65 having metal trace 47, PMIC package 1, and inductor 44. Inductor 44 is disposed directly above metal trace 47. In this example, power supply circuit 81 is realized as a buck power converter. In another example, power supply circuit 81 is a buck-boost power converter. In yet another example, power supply circuit 81 is a boost power converter. In yet another example, power supply circuit 81 a cuk power converter. In yet another example, power supply circuit 81 is a single-ended primary-inductor converter (SEPIC).

Although certain specific embodiments are described above for instructional purposes, the teachings of this patent document have general applicability and are not limited to the specific embodiments described above. In the example of FIG. 10, PMIC package 1 utilizes two package terminals CSG 18 and CSG 19 for outputting current signals 210 and 212. However, a single package terminal can be used instead of two separate package terminals for outputting current signals 210 and 212. For example, in another embodiment, a single package terminal is used to supply first current signal 210 onto metal trace 47 and the single package terminal is also used to supply second current signal 212 onto inductor 44. In the flowchart of method 200 shown in FIG. 11, the supplying of the first current signal in step 201 occurs before the supplying of the second current signal in step 202. However, in another example, the second current signal is supplied onto the inductor before the first current signal is supplied onto the metal trace. In yet another example, the first and second current signals are supplied simultaneously such that the first current signal is supplied onto the metal trace at the same time as the second current signal is supplied onto the inductor. Accordingly, various modifications, adaptations, and combinations of various features of the described embodiments can be practiced without departing from the scope of the invention as set forth in the claims.

What is claimed is:

1. A system comprising:
   a Printed Circuit Board (PCB) comprising a metal trace, wherein the metal trace has a first end and a second end;
   a Direct Current Resistance (DCR) sense circuit disposed on the PCB, wherein the DCR sense circuit comprises a resistor, a capacitor, and an inductor, wherein the inductor is disposed directly above the metal trace, and wherein the indicator surrounds part of the metal trace; and
   a packaged integrated circuit having a first package terminal and a second package terminal, wherein the first package terminal is coupled to the first end of the metal trace, wherein the second package terminal is coupled to the second end of the metal trace, and wherein the packaged integrated circuit detects changes in temperature using the metal trace during a DCR sensing operation.

2. The system of claim 1, wherein the inductor has a length, and wherein no discrete temperature sensing device is within two times the length of the inductor.

3. The system of claim 1, wherein the metal trace is of a metal type, and wherein the inductor includes windings of the metal type.

4. The system of claim 1, wherein the metal trace exhibits a first temperature coefficient, wherein the inductor includes windings that exhibit a second temperature coefficient, and wherein the first temperature coefficient is substantially equivalent to the second temperature coefficient.

5. The system of claim 1, wherein the packaged integrated circuit is configurable to perform temperature compensation of a sensed DCR current, and wherein the temperature compensation involves the metal trace.

6. The system of claim 5, wherein only the DCR sense circuit and the metal trace are used to perform temperature compensated DCR current sensing, and wherein no packaged temperature sensing device is involved in performing the temperature compensated DCR current sensing.

7. The system of claim 1, wherein the resistor has a first lead and a second lead, wherein the capacitor has a first lead and a second lead, wherein the inductor has a first lead and a second lead, wherein the first lead of the capacitor is coupled to the second lead of the resistor, wherein the first lead of the resistor is coupled to the first lead of the inductor, and wherein the second lead of the capacitor is coupled to the second lead of the inductor.

8. The system of claim 1, wherein the inductor is part of a power supply circuit, and wherein the power supply circuit is disposed on the PCB.

9. The system of claim 8, wherein the power supply circuit is taken from the group consisting of: a buck power converter, a buck-boost power converter, a boost power converter, a cuk power converter, and a single-ended primary-inductor converter (SEPIC).

10. The system of claim 1, wherein the metal trace has a shape taken from the group consisting of: a square wave shape, a sawtooth wave shape, a triangle wave shape, and a spiral shape.

11. A method comprising:
generating a signal indicative of an output current of a power converter, wherein the output current flows through an inductor of the power converter, wherein the inductor is part of a Direct Current Resistance (DCR) sense circuit, wherein a metal trace is disposed below the inductor such that part of the metal trace is covered by the Inductor, wherein the signal indicative of the output current of the power converter is generated in part by sensing a voltage across the metal trace, and wherein the voltage that is sensed Indicates temperature variations near the Inductor during operation of the DCR sense circuit.

12. The method of claim 11, wherein the metal trace has a shape taken from the group consisting of: a square wave shape, a sawtooth wave shape, a triangle wave shape, and a spiral shape.

13. The method of claim 11, wherein no temperature sensing device is disposed within 50.0 millimeters of the inductor of the power converter.

14. The method of claim 11, wherein the power converter is taken from the group consisting of: a buck power converter, a buck-boost power converter, a boost power converter, a cuk power converter, and a single-ended primary-inductor converter (SEPIC).

15. The method of claim 11, wherein the generating of the signal indicative of the output current of the power converter is performed within an integrated circuit having a first terminal and a second terminal, wherein the first terminal is coupled to a first end of the metal trace, and wherein the second terminal is coupled to a second end of the metal trace.

16. The method of claim 15, wherein no structure is coupled between the first terminal and the first end of the metal trace, and wherein no structure is coupled between the second terminal and the second end of the metal trace.

17. The method of claim 15, wherein the integrated circuit does not include any terminal adapted to receive a signal from a discrete temperature sensing device.

18. A packaged integrated circuit comprising:
a plurality of terminals, wherein a first terminal of the plurality of terminals is coupled to a first end of a metal trace, wherein a second terminal of the plurality of terminals is coupled to a second end of the metal trace, and wherein the metal trace is disposed below an inductor of a power supply circuit; and
means for generating a signal indicative of an output current of a power converter, wherein the output current flows through an inductor of the power converter.

19. The packaged integrated circuit of claim 18, wherein the means is an inductor current detection and calibration circuit, and wherein the inductor current detection and calibration circuit is coupled to detect a voltage between the first terminal and the second terminal.

20. The packaged integrated circuit of claim 18, wherein no temperature sensing device is used by the means for generating the signal indicative of the output current of the power converter, and wherein the power converter is taken from the group consisting of: a buck power converter, a buck-boost power converter, a boost power converter, a cuk power converter, and a single-ended primary-inductor converter (SEPIC).

* * * * *